United States Patent [19]

Hori et al.

[11] Patent Number: 4,716,313

[45] Date of Patent: Dec. 29, 1987

[54] PULSE DRIVE CIRCUIT

[75] Inventors: Ryoichi Hori, Nishitama; Kiyoo Itoh, Higashikurume; Jun Etoh, Hachioji, all of Japan

[73] Assignee: Hitachi, Ltd., Tokyo, Japan

[21] Appl. No.: 58,617

[22] Filed: Jun. 3, 1987

Related U.S. Application Data

[63] Continuation of Ser. No. 620,894, Jun. 15, 1984, abandoned.

[30] Foreign Application Priority Data

Jun. 15, 1983 [JP] Japan .................. 58-105710

[51] Int. Cl.$^4$ .................. H03K 5/02; H03K 17/08; H03K 17/28; H03K 17/284
[52] U.S. Cl. .................. 307/475; 307/450; 307/296 R; 307/270; 307/264; 365/189
[58] Field of Search .............. 307/475, 450, 468, 469, 307/296 R, 297, 304, 270, 264; 365/102, 104, 189, 203

[56] References Cited

U.S. PATENT DOCUMENTS

| | | | |
|---|---|---|---|
| 3,932,773 | 1/1976 | Lüscher et al. .................. | 307/265 |
| 4,090,096 | 5/1978 | Nagami .................. | 307/265 |
| 4,441,035 | 4/1984 | Demetriou .................. | 307/475 X |
| 4,451,745 | 5/1984 | Itoh et al. .................. | 307/475 |
| 4,469,959 | 9/1984 | Luke et al. .................. | 307/475 X |
| 4,475,050 | 10/1984 | Noufer .................. | 307/475 |
| 4,482,824 | 11/1984 | Tzeng .................. | 307/468 X |
| 4,494,015 | 1/1985 | Frieling et al. .................. | 307/268 |
| 4,499,387 | 2/1985 | Konishi .................. | 307/268 |
| 4,555,642 | 11/1985 | Morales .................. | 307/475 |
| 4,584,491 | 4/1986 | Ulmer .................. | 307/475 |
| 4,585,955 | 4/1986 | Uchida .................. | 307/475 X |
| 4,626,704 | 12/1986 | Takata et al. .................. | 307/264 |
| 4,631,426 | 12/1986 | Nelson et al. .................. | 307/450 |

FOREIGN PATENT DOCUMENTS 0130294 8/1982 Japan .................. 365/104

OTHER PUBLICATIONS

Dingwall, "TTL to CMOS Buffer Circuit", RCA Technical Notes, No. 1114, pp. 1-3, Jun. 11, 1975.

*Primary Examiner*—Stanley D. Miller
*Assistant Examiner*—David R. Bertelson
*Attorney, Agent, or Firm*—Antonelli, Terry & Wands

[57] ABSTRACT

In order to drive a capacitance load at a high speed without an undesirably large increase in the circuit size, a driving arrangement is provided to charge the capacitance load in accordance with a limited voltage. A voltage limiter is coupled to a supply voltage providing a predetermined limited voltage. A pulse generator is coupled to receive the limited voltage and to provide output pulses which are, in turn, limited in accordance with the output voltage of the voltage limiter. A driver is coupled between the supply voltage and the capacitance load, and is controlled by the output pulses of the pulse generator. In this way, the capacitance load is charged through the driver in accordance with the limited voltage. Since the voltage limiter is not arranged along a series connection between the driver and the capacitance load, the internal equivalent resistance of the voltage limiter does not detrimentally influence the resistance along the series connection.

9 Claims, 21 Drawing Figures

PULSE DRIVE CIRCUIT

This is a continuation of application Ser. No. 620,894, filed on June 15, 1984, now abandoned.

BACKGROUND OF THE INVENTION

The present invention relates to a pulse control circuit which is suitable for driving a capacitance load at high speed.

Reductions in the sustain voltage of elements which have resulted from the recent miniaturization of bipolar or MOS transistors have tended to reduce the operating voltages of integrated circuits. From the user's point of view, conventional supply voltages, such as supply voltages in units of 5 V, are desirable for ease of use. It is considered that means by which it will be possible to satisfy both the needs of the manufacturers of integrated circuits and the users is a reduction of the external supply voltage Vcc within the chips and the operation of miniaturized elements by a voltage $V_L$ which has been lowered thereby.

Figure 1A:
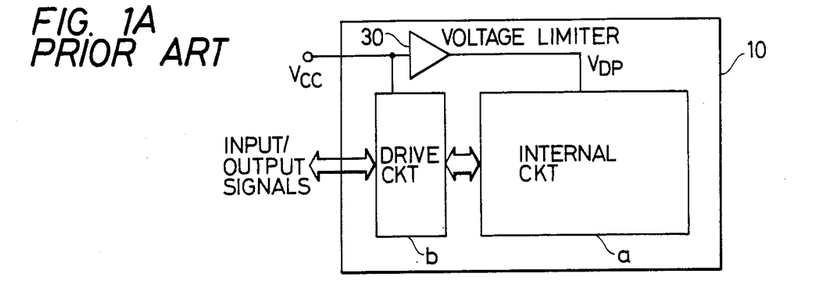
FIG. 1A is a diagram of the chip structure of a conventional semiconductor circuit.
Figure 1B:
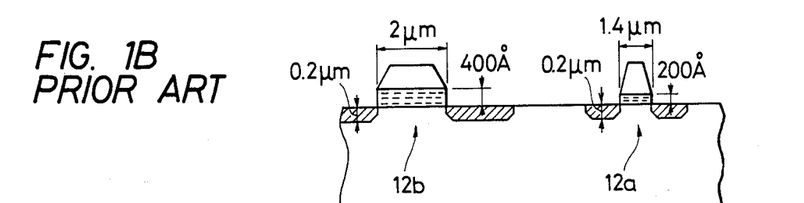
FIG. 1B is a diagram of an example of the structure of two transistors used in the chip of FIG. 1A.

FIG. 1A is taken from U.S. patent application No. 368,162 applied for by the present Applicant. A miniaturized element 12a of FIG. 1B is used in an internal circuit a which determines the effective integration density of chips 10, and the remedy for the reduction in the voltage resistance resulting from miniaturization is to operate the element by a voltage $V_{DP}$ which is the external supply voltage Vcc reduced by a voltage limiter 30. However, it is usually easier to design a drive circuit b which uses a higher supply voltage and which includes, for example, an input-output interface, which does not contribute much to the integration density. Thus, a comparatively large element 12b, as shown in FIG. 1B, is used for the driving circuit b which is operated by applying Vcc thereto.

A chip is a single substrate on which memory, logic or other LSI devices are fabricated. In a memory LSI device, a from FIG. 1A is a memory array and its related circuits. On the other hand, in a logic LSI device, a is an area constructed of repeated cells making up the ROM or RAM area of a microcomputer. Details of embodiments of voltage limiters using this voltage limiter system are given in U.S. patent application Nos. 368,162 and 562,969.

When this kind of voltage limiter system is utilized for charging a capacitance load which has only a low voltage resistance in the circuit a, the output $V_{DP}$ of the voltage limiter 30 is supplied to the drain of a charging transistor as a supply voltage and, pulses of the same level as that of the external supply voltage Vcc are applied to the gate of the transistor, turning the transistor on.

Figure 2:
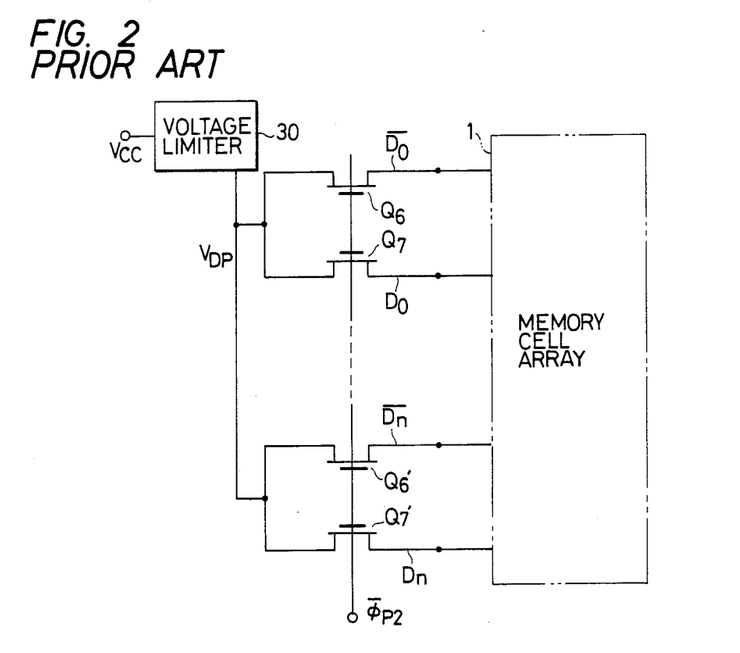
FIG. 2 is a diagram of a precharge circuit for data lines of a semiconductor memory.

In FIG. 2, a precharge circuit for a data line of a semiconductor memory is shown as an example of this type of circuit. In FIG. 2, charging transistors $Q_6$, $Q_7$ controlled by precharge pulse $\overline{\phi_{P2}}$ of a maximum level of Vcc charge data lines $D_0$ and $\overline{D_0}$ to a voltage as large as the output voltage $V_{DP}$ of the voltage limiter 30. Numeral 1 denotes a memory cell array.

However, in this circuit, the equivalent internal resistance of the voltage limiter 30 is connected in series to the equivalent resistances of the charging transistors $Q_6$ or $Q_7$ when they are on, and thus it is necessary to make these resistances much smaller to enable charging at a higher speed when there is a larger capacitance load. For that purpose, the size of the transistors in the voltage limiter 30 and the transistors $Q_6$, $Q_7$ must be larger, and thus it can be understood that it is difficult to drive a large capacitance load faster when there must be a high degree of integration.

SUMMARY OF THE INVENTION

An object of the present invention is to provide a pulse drive circuit which is suitable for driving a large capacitance load at high speed.

In order to drive a capacitance load at a high speed without an undesirably large increase in the circuit size, a driving arrangement is provided to charge the capacitance load in accordance with a limited voltage. A voltage limiter is coupled to a supply voltage providing a predetermined limited voltage. A pulse generator is coupled to receive the limited voltage and to provide output pulses which are, in turn, limited in accordance with the output voltage of the voltage limiter. A driver is coupled between the supply voltage and the capacitance load, and is controlled by the output pulses of the pulse generator. In this way, the capacitance load is charged through the driver in accordance with the limited voltage. Since the voltage limiter is not arranged along a series connection between the driver and the capacitance load, the internal equivalent resistance of the voltage limiter does not detrimentally influence the resistance along the series connection.

DESCRIPTION OF THE PREFERRED EMBODIMENTS

Figure 3:
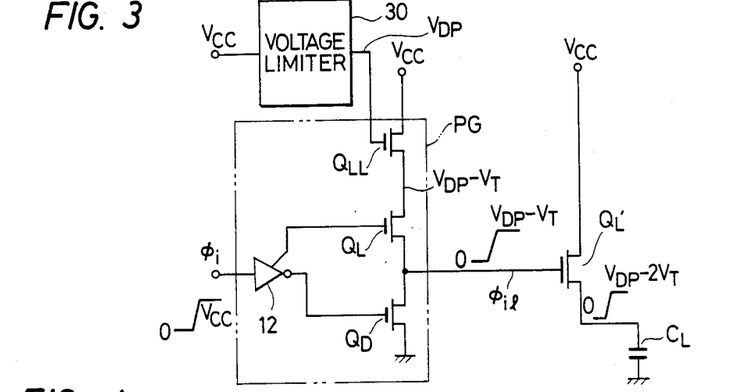
FIG. 3 is a circuit diagram of a first embodiment of the present invention.

FIG. 3 shows a fundamental embodiment of the present invention. A signal $\phi_{il}$ whose amplitude is controlled by the operation of a pulse-generating circuit PG is input to a gate of a MOS transistor $Q_L'$, and a capacitance load $C_L$ connected to the source of the transistor is driven thereby.

The pulse-generating circuit PG inputs pulse $\phi_i$ of a maximum voltage equivalent to the supply voltage Vcc.

Details of this pulse-generating circuit PG and its operation are given in "Electronics" Mar. 24th, 1982, pp. 132-136. An outline thereof is provided below.

An inverted output of a driver 12 to which the input pulse $\phi_i$ is applied makes a MOS transistor $Q_D$ discharge its gate voltage so that its electric potential changes from high to low. Simultaneously, a bootstrap capacitance (not shown) acts so that the gate voltage of a transistor $Q_L$ is charged by a non-inverted output of the driver 12 so that its low potential becomes a high potential of at least the level of Vcc, turning the transistor $Q_L$ on.

An internal supply voltage $V_{DP}$ which is different from the external supply voltage Vcc and is applied to the gate of a transistor $Q_{LL}$ so that a voltage of $V_{DP}-V_T$ is applied to the drain of transistor $Q_L$. Thus, the output $\phi_{il}$ rises from a low voltage of zero to the drain voltage $V_{DP}-V_T$ of the transistor $Q_L$. $V_T$ denotes the threshold voltage of each transistor in this embodiment.

The external supply voltage Vcc is applied to the drain of transistor $Q_L'$, but the capacitance load $C_L$ is charged by a voltage of up to $V_{DP}-2V_T$ which is equal to the high voltage $V_{DP}-V_T$ of the pulse $\phi_{il}$ reduced by the threshold voltage $V_T$ of the transistor $Q_L'$. By suitably increasing the size of transistor $Q_L'$ alone, that is, by increasing the magnitude of W/L (channel width/channel length), it is possible to drive the capacitance load $C_L$ at high speed, however large $C_L$ is. Concrete details of circuits embodying the voltage limiter 30 are disclosed in U.S. patent application Nos. 368,162 and 562,969. One example of these will now be described with reference to FIG. 4. This embodiment removes the problem often encountered in the prior art that, when charging the capacitance load $C_L$ the voltage limiter and the charge-control transistors must all be large-sized transistors. When the voltage with which the capacitance load $C_L$ is charged is $V_{out}$ (hereinafter, "signal voltage" denotes any voltage on the high electric potential side, without particular limitations), the voltage of the pulse $\phi_{il}$ is $V_{in}$ and the threshold voltage of the transistor $Q_L$ is $V_T$, $V_{out}$ is generally given by:

$$V_{out} = V_{in} - V_T \quad (1)$$

Accordingly, a control of the output voltage on the high electric potential side can be accomplished by controlling $V_{in}$ which can be defined in response to the essential voltage $V_{out}$.

Thus for $V_{in}$ it is necessary to generate a voltage which is higher than the required charge voltage by the voltage $V_T$. For this purpose, the output voltage $V_{DP}$ of the voltage limiter 30 of FIG. 3 could be modified.

Figure 4:
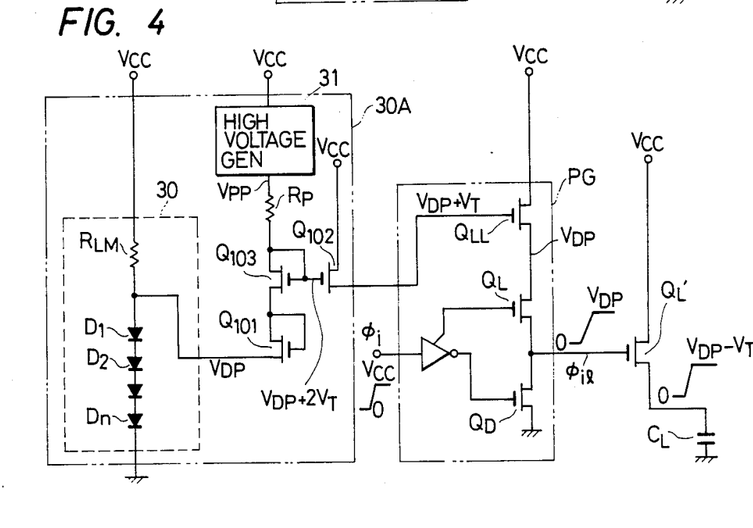
FIG. 4 is a circuit diagram of a second embodiment of the present invention.
Figure 5:
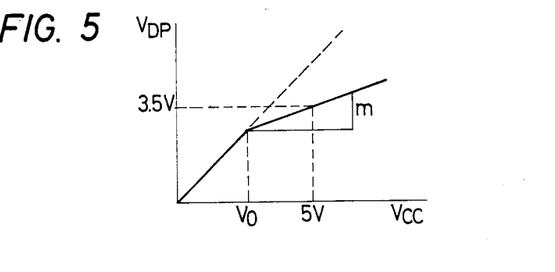
FIG. 5 is a graph of the output characteristic of the voltage limiter 30 used in the circuit of FIG. 4.

FIG. 4 discloses an embodiment in which the voltage of $V_{DP}-V_T$ is applied to the capacitance load $C_L$. FIG. 4 differs from FIG. 3 only in that a voltage limiter 30A is designed so that it outputs a voltage $V_{DP}+V_T$ which is only $V_T$ higher than the output $V_{DP}$ of the voltage limiter 30 of FIG. 3. FIG. 4 shows a concrete example of the voltage limiter 30 which outputs $V_{DP}$ from a contact point between a resistor $R_{LM}$ and a series of n diodes $D_1$ to $D_n$. The voltage limiter 30 outputs the voltage $V_{DP}$ of which has a characteristic as shown in FIG. 5 with respect to the external supply voltage Vcc. This characteristic shows that if the external supply voltage Vcc is less than $V_0$, the output of the voltage limiter is equal to Vcc; and if it is greater than $V_0$, the output thereof varies with a gradient of m which is less than 1. When the standard voltage is 5 V, $V_0$ is selectively defined by a value which is less than 5 V; and when Vcc is 5 V, $V_{DP}$ can be determined to be, for example, 3.5 V by this characteristic.

$V_0$ is equal to the external supply voltage when the n series-connected diodes $D_1$ to $D_n$ of FIG. 4 start to be turned on. The gradient m is defined by the ratio of the resistance $R_{LM}$ in series with the resistance of the group of diodes $D_1 \ldots D_n$ when on.

Returning to FIG. 4, a high-voltage generation circuit 31 generates a voltage $V_{pp}$ which is higher than the external supply voltage Vcc. This circuit will be described later with reference to FIGS. 6A and 6B.

In FIG. 4, two transistors $Q_{103}$, $Q_{101}$, which are arragned so that the drain of one is connected to the gate of other, and a resistance $R_p$ are connected in series between an output terminal of the high-voltage generation circuit 31 and an output terminal of the limiter 30. Thus, the drain voltage of transistor $Q_{103}$ is equal to $V_{DP}+2V_T$. Since this voltage $V_{DP}+2V_T$ is applied to the gate of a transistor $Q_{102}$ whose drain receives the external supply voltage Vcc, $V_{DP}+V_T$ is applied to the gate of the transistor $Q_{LL}$ in the pulse-generating circuit PG. Accordingly, the high electric potential of the pulse $\phi_{il}$ is equal to $V_{DP}$ and so a charging voltage of up to $V_{DP}-V_T$ is applied to the capacitance load $C_L$. The output voltage $V_{pp}$ of the high-voltage generation circuit 31 is set by the formula:

$$V_{pp} \geq V_{DP} + 2V_T$$

Figure 6A:
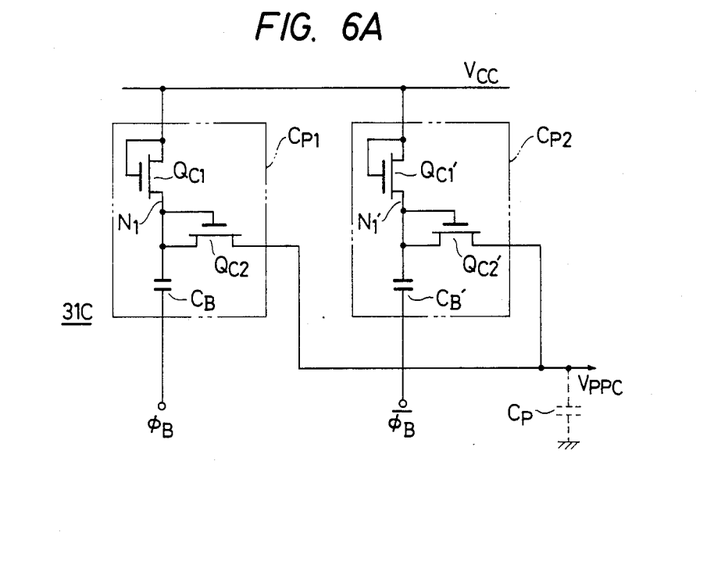
FIGS. 6A and 6B illustrate the high-voltage generation circuit (31c) used in the embodiment of FIG. 4.
Figure 6B:
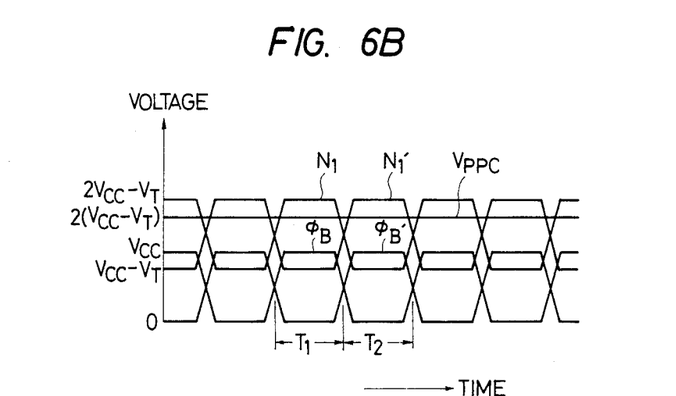

The high-voltage generation circuit 31 will now be described with reference to the circuit diagram thereof of FIG. 6A. A circuit $C_{p1}$ has a construction and operation such that pulse $\phi_B$ is applied through a charge-pump capacitor $C_B$ to a node between two transistors $Q_{c1}$ and $Q_{c2}$ arranged so that the source of $Q_{c1}$ is connected to the gate of $Q_{c2}$, and pulses higher than Vcc are generated. A circuit $C_{p2}$ also comprises of two transistors $Q_{c'1}$ and $Q_{c'2}$ connected in the same state as in circuit $C_{p1}$ and a charge-pump capacitor $C_{B'}$. However, it differs from $C_{p1}$ in that pulse $\overline{\phi_B}$ is generated. The sources of transistors $Q_{c2}$ and $Q_{c'2}$ for a wired OR. $\phi_B$ and $\overline{\phi_B}$, respectively are pulses of a certain period and inverses thereof, in a chip. The circuits for producing these pulses are not shown in the drawings for simplicity. $C_p$ denotes a parasitic capacitance generated in the output wiring. Nodes $N_1$ and $N_1'$ respectively of transistors $Q_{c1}$ and $Q_{c'1}$ of FIG. 6B are precharged to the voltage Vcc $-V_T$. Each of the pulses $\phi B$ and $\overline{\phi B}$ then reach Vcc during each of time bands $T_1$, $T_2$, respectively, when the corresponding nodes $N_1$ and $N_1'$ are raised to 2Vcc $-V_T$ during $T_1$ and $T_2$ by the capacitive coupling of charge-pump capacitors $C_B$ and $C_{B'}$, respectively. This voltage appears as an output voltage $V_{pp}$ through transistors $Q_{c2}$, $Q_{c2}'$ but the voltage is reduced by the threshold voltage $V_T$ of the transistors $Q_{c2}$, $Q_{c2}'$ and thus $V_{pp}$ is given by the formula $V_{pp}=2(Vcc-V_T)$. As a result, the output $V_{pp}$ becomes a d.c. voltage which is greater than Vcc.

Since the high-voltage generation circuit 31 receives the charges of the capacitors $C_B$, $C_B'$ output during both time bands $T_1$, $T_2$, the ability of the circuit to supply charge is great, and a ripple noise in its output $V_{pp}$ is low.

Figure 7:
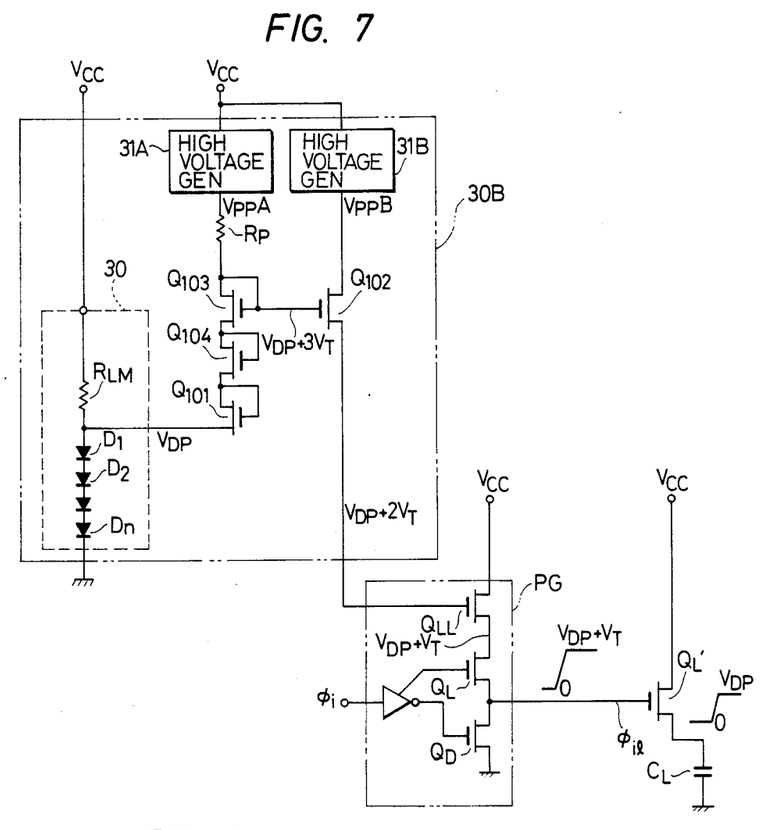
FIG. 7 is a circuit diagram of a third embodiment of the present invention.

FIG. 7 shows an embodiment which can charge the capacitance load $C_L$ to the voltage $V_{DP}$. The circuit shown in FIG. 7 differs from that of FIG. 4 in that a voltage limiter 30B is constructed so that the output voltage $V_{DP}$ of the voltage limiter 30 is raised to $V_{DP}+2V_T$. Namely, the circuit in FIG. 7 differs from that of FIG. 4 in that the drain and gate of a transistor $Q_{104}$ are connected in series to transistors $Q_{101}$ and $Q_{103}$ and high voltages $V_{ppA}$ and $V_{ppB}$ generated by voltage generation circuits 31A and 31B are applied to the drain of a transistor $Q_{102}$ and a resistor $R_p$, respectively.

The gate voltage of the transistor $Q_{103}$ is made to be $V_{DP}+3V_T$ by activating the transistor $Q_{104}$. Thus, a voltage which is higher by $V_T$ than that in the circuit of FIG. 4 is applied to the gates of transistors $Q_{LL}$, $Q_L'$, and the capacitance load $C_L$ is charged to the voltage $V_{DP}$.

In addition, the high-voltage generation circuit 31B supplies the transistor $Q_{LL}$ with a voltage $V_{ppB}$ which value is $V_{DP}+2V_T$, in order to raise the gate voltage of the transistor $Q_L$, to $V_{DP}+V_T$ which is higher than that in FIG. 4.

The output $V_{ppA}$ from the high-voltage generation circuit 31A must be greater that the drain voltage $V_{DP}+3V_T$ of the transistor $Q_{103}$.

Ordinary integrated circuits are subjected to aging tests after the final production step in order to ensure their reliability. These aging tests are designed to detect any transistor in which basic problems are likely to occur because of a failure of its gate oxide film, and are performed by deliberately applying to each transistor in the circuit a voltage which is higher than those encountered during normal usage. It is necessary to apply to each element a voltage which is slightly lower than the destructive voltage of a normal element in order to improve the chances of finding failures with these aging tests. For an integrated circuit chip which is so constructed that a supply voltage is supplied through a voltage limiter within the chip, examples which can accomplish these aging tests, even for the circuit part a of FIG. 1 which has a low voltage resistance, are disclosed in U.S. Patent Application Nos. 368,162 and 562,969.

It is desirable that the present invention can accomplish these aging test. In the embodiments thereof shown in FIGS. 3, 4 and 7, the voltage limiter 30 varies the output voltage $V_{DP}$ in accordance with the characteristic of FIG. 5. Thus, if the gradient m is selected to have a certain magnitude, the output $V_{DP}$ can be charged to the voltage required for the aging tests by varying the magnitude of Vcc. This change means that the voltage applied to the load capacitance $C_L$ can be varied, and thus the aging tests can be accomplished for the load capacitance $C_L$.

However, when Vcc is near the normal operating voltage 5 V, it is better not to change $V_{DP}$ much if Vcc is varied. For this purpose, it is desirable to minimize the gradient m of the characteristic of FIG. 5 as far as possible. Therefore, in the voltage limiter 30 of FIGS. 3, 4 and 7, when the external voltage Vcc is greater than Vo', which is greater than the normal operating voltage 5 V, it is desirable, as shown in FIG. 8, to generate $V_{DP}$ so that its characteristic varies with respect to the voltage Vcc above the voltage Vo with a gradient m' that is greater than the gradient m when Vcc is between the voltages Vo and Vo'.

Figure 8:
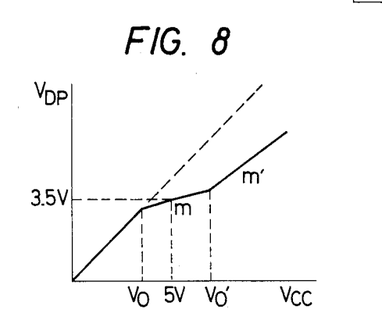
FIG. 8 is a graph of the output characteristic of the voltage limiter (30D) used in the circuit of FIG. 9.
Figure 9:
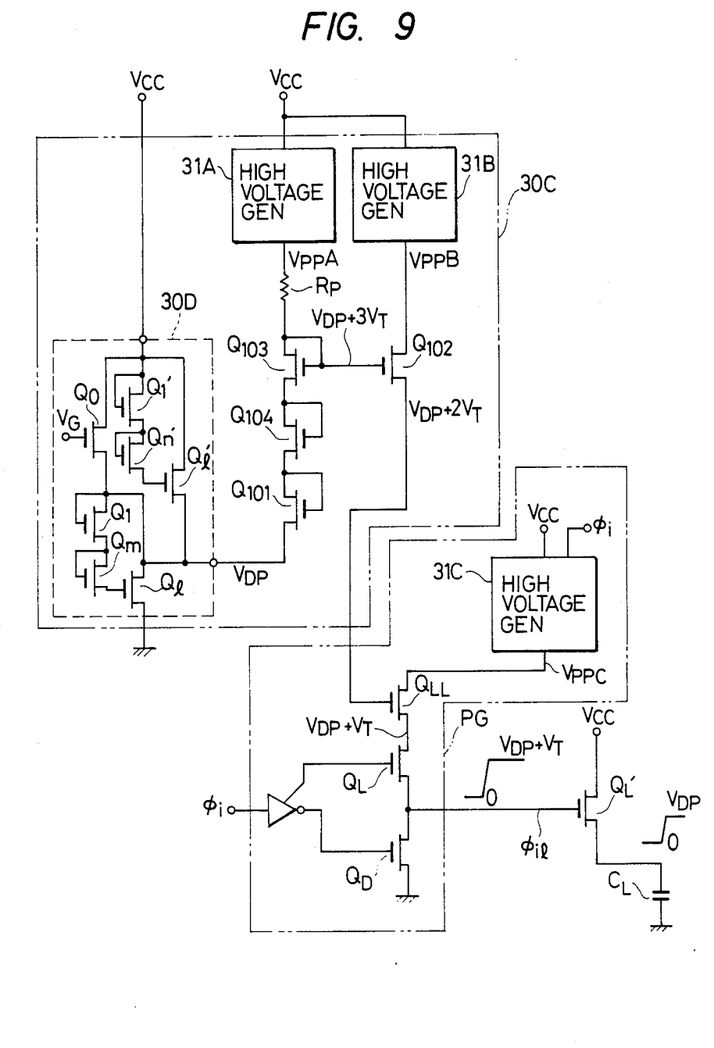
FIG. 9 is a circuit diagram of a fourth embodiment of the present invention.

FIG. 9 shows an embodiment in which the capacitance load $C_L$ is supplied with a voltage which varies in accordance with the characteristic of FIG. 8.

FIG. 9 differs from FIG. 7 in that a voltage limiter 30D is used instead of the voltage limiter 30 of FIG. 7. The circuit of the voltage limiter 30D is disclosed in U.S. Patent Application Nos. 368,162 and 562, 969. This voltage limiter 30D ouputs a voltage $V_{DP}$ which has the characteristic shown in FIG. 8. Namely, in FIG. 9, $V_G$ (for example, $Vcc+2V_T$) is applied to the gate of a transistor $Q_o$ of the voltage limiter 30D. The magnitude of the voltage $V_G$ is selected so that it can turn $Q_o$ on. When the magnitude of the external supply voltage Vcc is between 0 and $V_0$, a transistor $Q_l$ is turned off, and thus the output $V_{DP}$ is equal to Vcc. When the external supply voltage Vcc is between $V_0$ and $V_0'$, the transistor $Q_l$ is turned on because transisors $Q_1$, $Q_m$ are on. Accordingly, the output $V_{DP}$ varies according to a gradient m (m < 1) determined by the conductance ratio of transistors $Q_o$ and $Q_l$.

When the external supply voltage Vcc is above $V_0'$, a transistor $Q_l'$ is turned on because transistors $Q_1'$ and $Q_n'$ are on. consequently, the output is defined by a gradient m' (m' > m) which is also determined by the ratio of conductance of transistors $Q_o$ and $Q_l$, and also by the sum of the conductances of the transistors $Q_o$ and $Q_l'$.

The circuit shown in FIG. 9 differs from that of FIG. 7 in that a high voltage $V_{ppc}$ generated by a high-voltage generation circuit 31C (which will be described later with reference to FIGS. 11A and 11B), is applied to the drain of the transistor $Q_{LL}$.

The voltage $V_{ppc}$ is selected to have a magnitude greater than that of the gate voltage $V_{DP}+V_T$ of the transistor $Q_{LL}$ even if that gate voltage varies. Thus, in the same way as in the circuit of FIG. 7, the voltage $V_{ppc}$ is applied to the capacitor $C_L$ even if the magnitude of $V_{DP}$ varies. As a result, the aging tests of the capacitance load $C_L$ can be accomplished by varying Vcc. It is obvious that the voltage limiter 30C of FIG. 9 can be used instead of the voltage limiter 30 of FIGS. 3, 4 and 7, and it also goes without saying that the high-voltage generation circuits 31A and 31B of FIG. 9 must generate output voltages $V_{ppA}$ and $V_{ppB}$ that are higher than $V_{DP}+3V_T$ and $V_{DP}+2V_T$ respectively, even if Vcc varies.

Figure 10A:
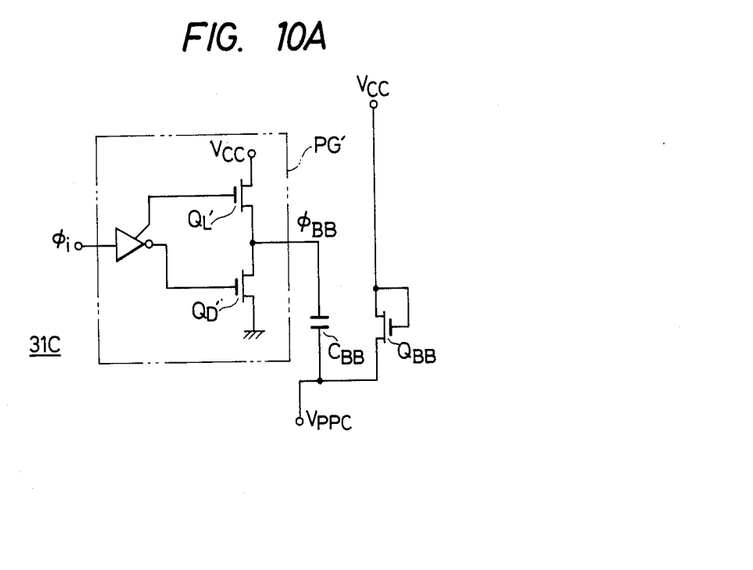
FIGS. 10A and 10B illustrate the voltage generation circuit (31C) used in the circuit of FIG. 8.

The high-voltage generation circuit 31C will now be described. A pulse-generating circuit PG', shown in FIG. 10A, differs from the pulse-generating circuit PG of FIG. 3 only in that it does not have the transistor $Q_{LL}$. Pulse $\phi_{BB}$ output from the pulse-generating circuit PG' are connected to the source of a transistor $Q_{BB}$ by a bootstrap capacitor $C_{BB}$. The drain and gate of the transistor $Q_{BB}$ are connected to the external supply voltage Vcc.

Figure 10B:
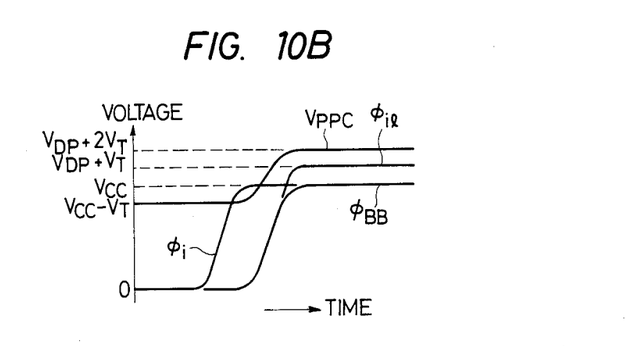

The operation of this voltage generation circuit 31C will now be described with reference to FIG. 10B. An output $V_{ppc}$ is precharged to the voltage $V_{CC}-V_T$ by the transistor $Q_{BB}$. When an input pulse $\phi_i$ of the pulse generation circuit PG' rises, an output pulse $\phi_{BB}$ starts to rise simultaneously with an output pulse $\phi_{il}$ of the pulse generation circuit PG (FIG. 9). The pulse $\phi_{BB}$ rises as far as Vcc, and $\phi_{il}$ rises to $V_{DP}+V_T$. In response to the rise of the pulse $\phi_{BB}$, $V_{ppc}$ rises because of the capacitive coupling of $C_{BB}$. The magnitude of $C_{BB}$ is such that the maximum value of $V_{ppc}$ becomes the voltage necessary for obtaining the source voltage $V_{DP}+V_T$ of a transistor $Q_{LL}$ (FIG. 9), that is, a voltage higher than $V_{DP}+V_T$. It is better to employ the voltage generation circuit 31C than a circuit which outputs $V_{ppc}$ continuously, because $V_{ppc}$ is generated only when a pulse $\phi_{il}$ is generated, and so the power consumption is reduced.

This means that the high-voltage generation circuits 31A and 31B can be constructed of the same circuit.

Figure 11A:
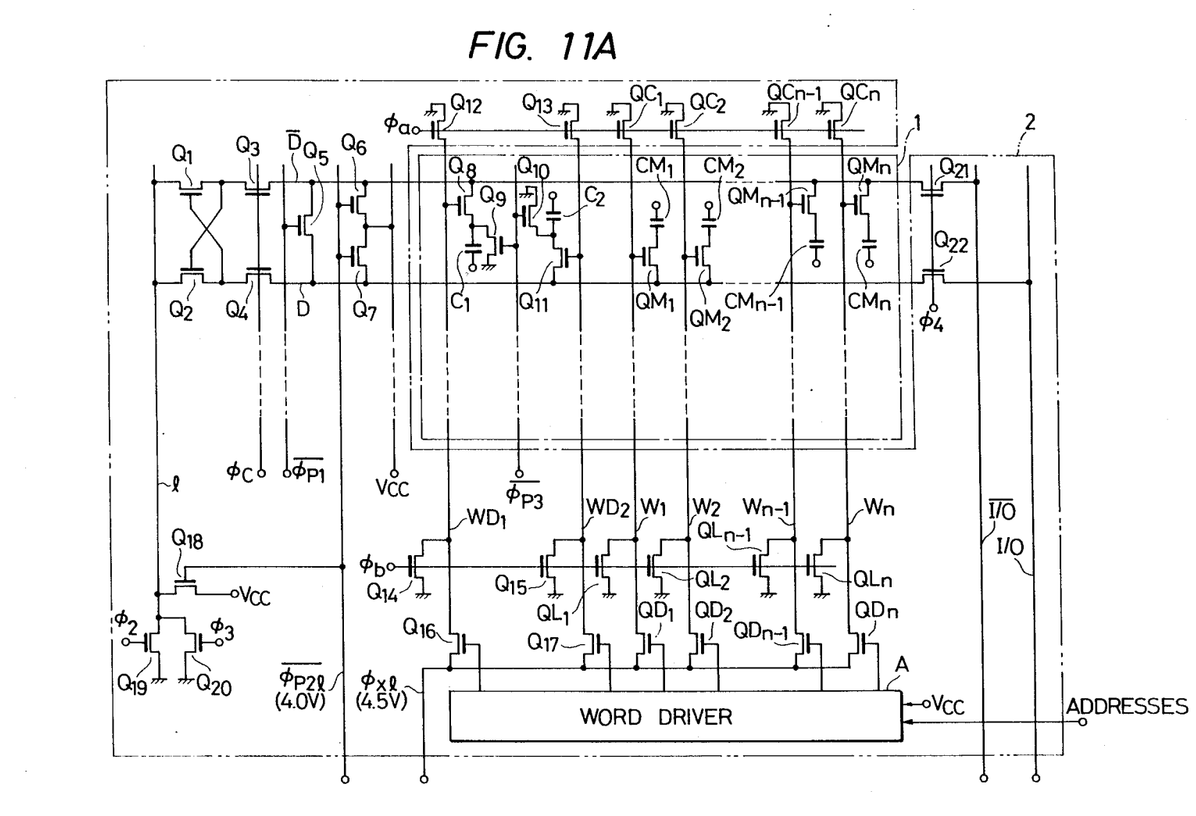
FIGS. 11A and 11B are circuit diagrams of two parts of a semiconductor memory of the present invention which are different from each other.
Figure 11B:
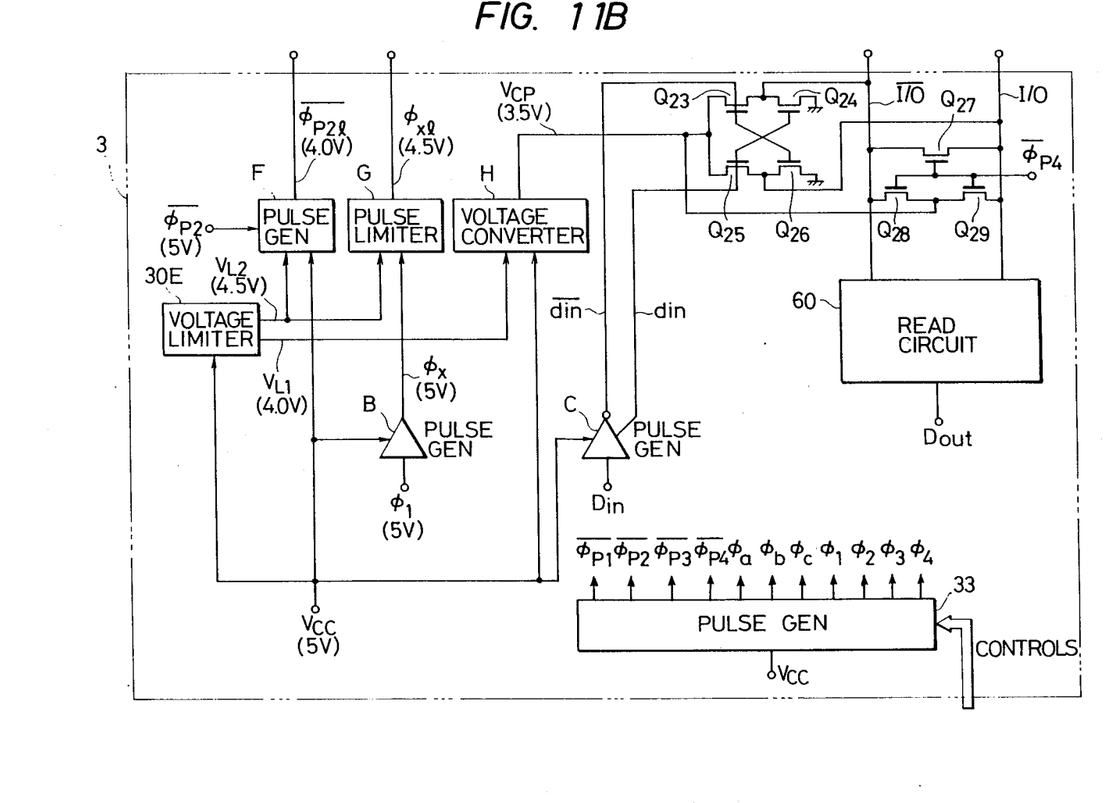

FIGS. 11A and 11B show an embodiment in which the present invention is applied to MOS dynamic memory with a single-transistor type memory cell. In these drawings, a group of circuits 1 enclosed within a dot-dash line comprise a memory array circuit. A group of circuits 2 enclosed within a dot-dot-dash line comprise circuits (direct peripheral circuits) which control the memory array circuit and amplify signals from memory cells. A group of circuits 3 enclosed within a triple-dot dash line denotes circuits (indirect peripheral circuits) which supply signals to the direct peripheral circuits, amplify memory signals from the memory array circuit, and write memory signals into the memory array circuit.

In the memory array 1, capacitors $C_1$ and $C_2$, transistors $Q_8$, $Q_9$ and $Q_{11}$, $Q_{12}$ represent dummy cells. Capacitors $CM_1$, $CM_2$ ... $CM_{n-1}$, $CM_n$ and transistors $QM_1$, $QM_2$ ... $QM_{n-1}$, $QM_n$ each form memory cells. Pulse $\phi_{p3}$ applied to the gates of transistors $Q_9$ and $Q_{10}$ are used to discharge the capacitors $C_1$, $C_2$ before reading, and is generated in a pulse-generating circuit 33.

A denotes a word driver circuit which generates word-selecting signals from address signals.

When a transistor $QD_1$ or $QD_2$ on a word line $W_1$ or $W_2$, respectively, is selected, the word driver circuit A raises the gate voltage of a transistor $Q_{16}$ on a dummy word line $WD_1$ to a higher level, and outputs a signal $\phi_{xl}$ to a dummy word line $WD_1$ and the appropriate word line $W_1$ or $W_2$.

On the other hand, when a transistor $QD_{n-1}$ or $QD_n$ on a word line $W_{n-1}$ or $W_n$, respectively, is selected, a transistor $Q_{17}$ on a dummy word line $WD_2$ is selected.

Transistors $Q_{21}$, $Q_{22}$ connect I/O and $\overline{\text{I/O}}$ lines to data lines D and $\overline{\text{D}}$ by pulses $\phi_4$.

Transistors $Q_1$, $Q_2$ form part of a sense amplifier and transistors $Q_3$, $Q_4$ act as switches to connect data lines to the sense amplifier.

Transistors $Q_6$, $Q_7$ are used for precharging and will be described later. A transistor $Q_5$ is used for switching between the short-circuiting of data lines $D_o$, $D_o'$.

A transistor $Q_{18}$ is used for precharging a line l, and transistors $Q_{19}$, $Q_{20}$ are used for driving the sense amplifier.

Figure 12:
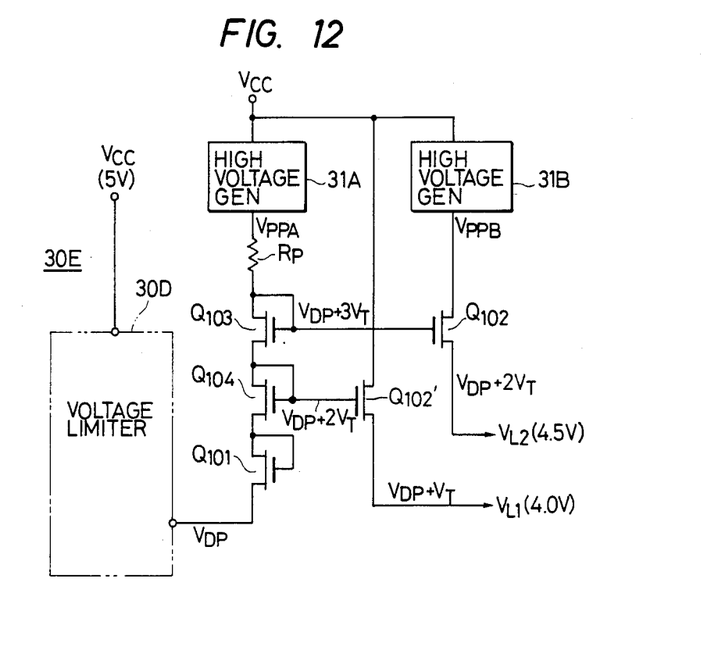
FIG. 12 is a circuit diagram of the voltage limiter (30E) used in the circuit of FIG. 11B.

A voltage limiter 30E outputs two voltages $V_{L1}$ and $V_{L2}$ through a circuit shown in FIG. 12. This circuit is formed by connecting the gate of the transistor $Q_{104}$ of the voltage limiter 30C of FIG. 9 to the transistor $Q_{102}$ of FIG. 4.

Each transistor is constructed to as to have a threshold voltage $V_T$ of 0.5 V, and a voltage limiter 30D is constructed so that $V_{DP}$ is 3.5 V when the external supply voltage Vcc is 5 V. Thus, the outputs $V_{L1}$ and $V_{L2}$ are 4.0 V and 4.5 V, respectively, when Vcc is 5 V.

The voltage limiter 30E can generate these two voltage magnitudes within a single circuit. Thus, the area of the semiconductor chip can be reduced, and fluctuations between $V_{L1}$ and $V_{L2}$ can be made smaller because the voltage limiter 30E operates on the basis of the same output $V_{DP}$ of the voltage limiter 30D.

In FIG. 11B, F denotes a circuit which receives a precharge signal $\overline{\phi_{P2}}$ (5 V) and also $V_{L2}$ (4.5), and which outputs a precharge signal $\overline{\phi_{P2l}}$ whose voltage is $V_T$ less than $V_{L2}$. F is composed of a circuit which is identical to the pulse-generating circuit PG of FIG. 9.

The data lines D, $\overline{\text{D}}$ and a common source terminal of the sense amplifier composed of the transistors $Q_1$, $Q_2$ is precharged to a voltage equal to $V_{L2}$ reduced by only the threshold voltage $V_T$, by transistors $Q_6$, $Q_7$ and $Q_{18}$ to the gates of which pulses are applied.

For example when the external supply voltage Vcc is 5 V and the threshold voltage is 0.5 V, the precharge voltage is 3.5 V.

Since there are numerous data lines within a memory, the total capacitance thereof is fairly large. However, according to the present invention, these lines can be precharged to a voltage which is lower than Vcc at high speed.

In order to prevent any differences in data line voltages caused by the difference between the threshold voltages of transistors $Q_6$ and $Q_7$, the gate voltage $\overline{\phi_{P1}}$ of $Q_5$ can be made higher than $\overline{\phi_{P2l}}$, transistor $Q_5$ is can be turned on to short-circuit lines D and $\overline{\text{D}}$.

I/O, $\overline{\text{I/O}}$ lines are common data input and output lines connected to a plurality of data lines.

In FIG. 11B, B denotes a pulse-generating circuit and C denotes another pulse-generating circuit which inputs write data Din and generate pulses din, $\overline{\text{din}}$ which are complementary to each other.

Numeral 33 denotes a circuit which inputs external control pulse signals at the voltage Vcc and generates pulses such as $\phi_{P1}$, $\overline{\phi_{P2}}$, etc.

Figure 13:
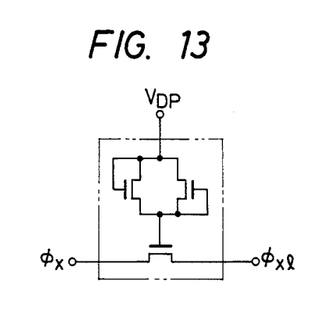
FIG. 13 is a circuit diagram of the pulse-limiting circuit (G) of FIG. 11B.

In FIG. 11B, G denotes a circuit which receives a signal $\phi_x$ of a voltage amplitude of 5 V and also $V_{L2}$ (4.5 V), and which outputs a signal $\phi_{xl}$ of the same voltage amplitude as $V_{L2}$. This circuit, shown in FIG. 13, is well-known and is disclosed in U.S. patent application No. 368162 wherein it is described as a circuit for converting a signal amplidute, employing a self-bootstrapping effect. This signal $\phi_{xl}$ becomes a word line signal of a memory cell.

In this embodiment, the present invention is not applied to the driving circuit G for word lines $W_1$ ... $W_n$. That is the reason why, since only one word line should be selected and the capacitance thereof is small, the driving speed is made much faster by the circuit G. However, a component in which the present invention is applied must charge all the data lines at once so that the load on it is heavy, and its speed is must therefore be made slower by such means as the driving circuit G. If a data line is charged according to the present invention, it is clearly impossible to make the speed faster than the speed obtained when only one word line is charged by the driving circuit G. However the present invention is suitable for precharging a large capacitance load such as several data lines, etc., since high-speed charging is not needed.

Figure 14:
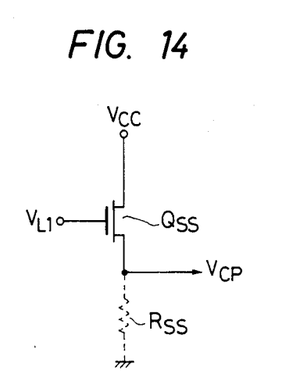
FIG. 14 is a circuit diagram of the voltage converter circuit (H) of FIG. 11B.

In FIG. 11B, H denotes a voltage converter circuit which receives $V_{L1}$ (4.0 V) and Vcc(5 V), and which generates a set up d.c. voltage of $V_{cp}$(3.5 V). As shown in FIG. 14, it is composed of a so-called source-follower transistor $Q_{ss}$ which inputs Vcc through its drain and $V_{L1}$ through its gate, and outputs $V_{cp}$ from its source. It is possible to stabilize the operation of the circuit by inserting a large resistance $R_{ss}$ between an output terminal and ground, and by passing a small current therethrough, as shown in FIG. 14. In the Figure, $V_{cp}$ is a precharge voltage supplied to the I/O and $\overline{I/O}$ lines, or it is a writing voltage in the writing circuit composed of transistors $Q_{23}$ to $Q_{26}$, and is set to 3.5 V, equal to the data line voltage.

In order to precharge the I/O, $\overline{I/O}$ lines, a conventional method of inputting the controlled voltage $V_{cp}$ to the drains of transistors $Q_{28}$, $Q_{29}$ is employed. However, in the same way as in the precharging means for data lines, it is possible to employ the method of controlling the voltages of the I/O, $\overline{I/O}$ lines at a predetermined magnitude by applying voltage-controlled pulse signals within the chip to the gates of the transistors $Q_{28}$, $Q_{29}$. The I/O, $\overline{I/O}$ lines can be precharged as fast as the data lines, so the present invention should be applied thereto. A circuit such as that shown in FIG. 12 is suitable for this purpose because it has a small capacitance and a convenient layout.

Figure 15:
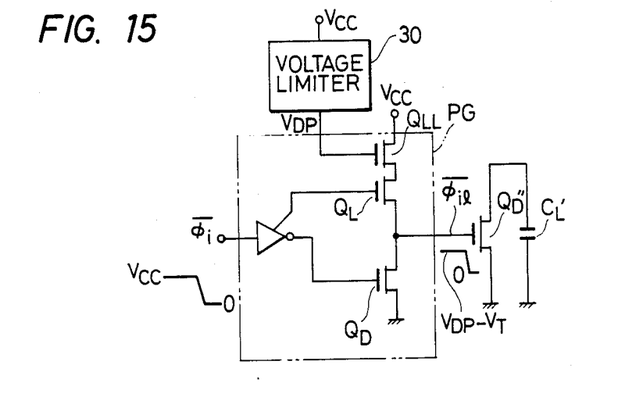
FIG. 15 is a circuit diagram of a fifth embodiment of the present invention which discharges a charge from a capacitance load.
Figure 16:
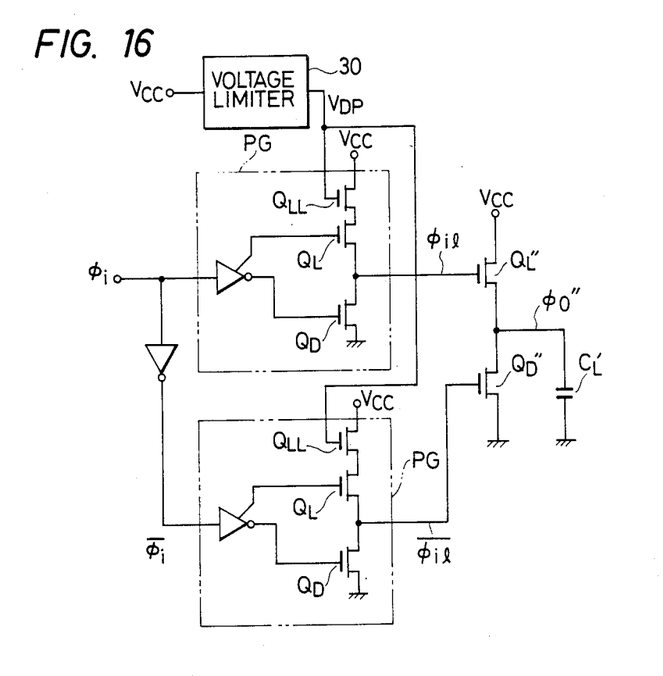
FIG. 16 is a circuit diagram of a sixth embodiment of a discharge circuit.

Circuits for discharging the capacitance load are shown in FIGS. 15 and 16.

FIG. 15 shows an embodiment in which a signal $\overline{\phi_{il}}$, an inversion of the signal $\phi_{il}$ of FIG. 3, is input to the gate of a transistor $Q'_D$, and an output can be extracted from the drain thereof. In this embodiment, the inverted signal $\overline{\phi_{il}}$ is output and the capacitance load $C'_L$ is driven on the basis of the driving ability of a transistor $Q_D''$ defined by its W/L ratio. Thus, in the same way as in the embodiment of FIG. 3, any size of driving ability can be obtained by selecting a suitable value of W/L.

FIG. 16 shows an embodiment in which a push-pull type of buffer circuit is constructed from two of the pulse-generating circuits PG of FIG. 3 which form an inverted signal and apply it and the original signal to the gates of transistors $Q_L''$, $Q_D''$. $\phi_{il}$ is input to $Q_L''$ and the inverted signal $\overline{\phi_{il}}$ of $\phi_{il}$ is input to $Q_D''$. An output $\phi_o''$ therefrom is a signal of the same phase as $\phi_{il}$ at a voltage controlled by the voltage of $\phi_{il}$. In the present embodiment, the rise term of $\phi_{il}$ of $\phi_o''$ and is output on the basis of the driving ability of transistor $Q_L''$ determined by the ratio W/L, and the fall term thereof is output according to that of transistor $Q_D''$. The driving ability required for each section can be easily obtained so that the capacitance load $C_L$ can be driven at high speed.

Each of these embodiments have been described using n-channel MOS transistors as examples, but p-channel MOS transistors can be employed if all the potential relationships are reversed. For example, if p-channel MOS transistors are used for the pulse-generating circuit and the supply voltage is −5 V (the circuit operates within the range of −5 V to 0 V), the circuit can be operate under conditions in which −5 V is applied to the drain of transistor $Q_L''$ and 0 V (ground) is applied to the source of transistor $Q_D''$. In this case, the output voltage is given by the formula $V_{out}=V_{in}-V_T$, in the same way as in formula (1), when the voltage of the input $\phi_{il}$ is $V_{in}$; so that if, for example, $V_{in}$ is −4 V and $V_T$ is −0.5 V (p-channel transistors have negative threshold voltages), $V_o=-4-(-0.5)=-3.5$ V. This means that the magnitude of $V_{in}$ can control $V_{out}$. If an operating range of from 0 V (corresponding to the previous −5 V) to 5 V (corresponding to the previous 0V) is wanted, the whole range can be shifted intact in the positive direction by 5 V. The drain of transistor $Q_L''$ can be set to 0V and that of transistor $Q_D''$ to 5 V so that $V_{in}=1$ V. The output voltage $V_{out}$ in this case is 1.5 V (a signal inverted by 1.5 V on the basis of +5 V). Both n-channel and p-channel MOS transistors are used for in a CMOS type of LSI device, and any of the above embodiments can be used therein, according to the purpose of the device. Bipolar transistors can be used instead of MOS transistor, the same operations as those of a MOS transistor can be accomplished by a circuit in which the collector, emitter and base of a bipolar transistor replace the drain, source and gate of a MOS transistor, respectively.

When this discharge circuit is used together with the voltage limiter 30 with the characteristics of FIGS. 4 and 9, the following effect is obtained, in the same way as in the charging circuit of FIG. 3. The amplitude of the voltage of the pulse signal applied to the gates of the transistors $Q_D''$ (in FIGS. 15 and 16) and $Q_L''$ (in FIG. 16) follows the curve of FIG. 5 when the external supply voltage Vcc is higher or lower than $V_o$, to control the operating speeds of the transistors $Q_D''$, $Q_L''$.

For example, in the transistor type of dynamic memory shown in FIGS. 11A and 11B, even when the external supply voltage Vcc is varied in order to stabilize the memory operations between the memory array 1 and the direct peripheral circuits 2 and the indirect peripheral circuits 3, it is necessary to maintain the matching between the operating speeds of each of the circuits.

However, when not using a voltage limiter such as that of FIGS. 5 and 8, in which the gradient m is controlled so that it is less than the variation in the external supply voltage Vcc, the operating speed depends on the operating and manufacturing conditions because each circuit has a different operating mode, so that it is difficult to maintain this matching. In particular in recent years, the wiring resistances within the memory array circuit 1, the direct peripheral circuits 2, etc., have increased because of the increased integration of memories, and also the characteristics of MOS transistors make it more difficult to match them to the circuits which determine the operating speed.

Figure 17:
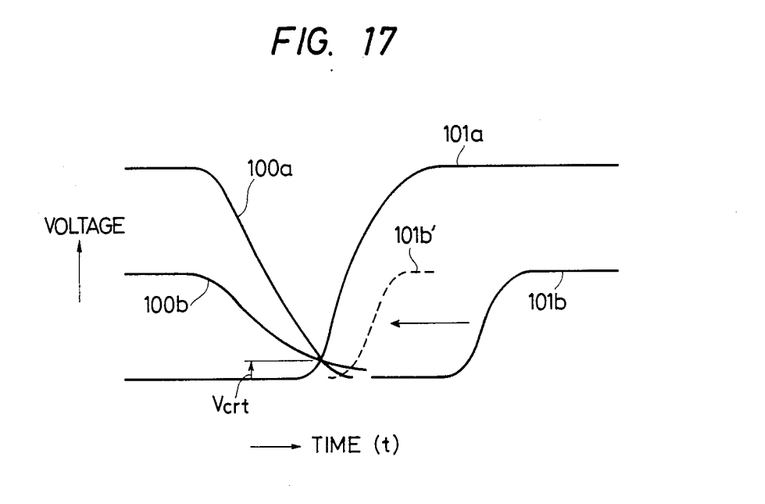
FIG. 17 is a graph illustrating conventional problems encountered when driving a capacitance load.

This problem is very important, particularly when the external supply voltage Vcc varies. FIG. 17 illustrates this state, with reference to an example in which a signal 101a must be generated when the waveform of a signal 100a has fallen below the voltage $V_{crT}$. This is equivalent to the relationship between the discharge speed (100a) for the data lines $D_o$, $\overline{D}_o$ during read-out and the signal $\phi_4$(101a) for extracting those signals onto the I/O line. 100b denotes the discharge speed for the data lines $D_o$, $\overline{D}_o$ when the external supply voltage $V_{cc}$ drops. Since the discharge speed for a data line is mainly controlled by its wiring resistance, the time taken for discharge as far as the voltage $V_{crT}$ hardly varies in comparison with the signal waveform of 100a in a memory array in which the integration density and wiring resistance have been increased. However, since $\phi_4$(100a) generated by the peripheral circuits is usually determined by the characteristics of several MOS transistors, the time taken for its generation is greatly delayed, as shown by the signal waveform 101b, when the external supply voltage Vcc drops.

In contrast, if an attempt is made to reduce the delay in the generation of the signal waveform 101b when the external supply voltage Vcc is low, the signal waveform 101b is generated earlier than that when the signal waveform 100b reaches $V_{crT}$ when the external supply voltage is high.

Thus, if one of the circuits shown in FIGS. 9, 15 and 16 is employed as a circuit controlling the delay in the signal waveform 101, the delay in the generation of the signal waveform due to variations in the external supply voltage Vcc can be eliminated.

This means that, since variations in the voltage output by the voltage limiter 30 are smaller than those in the external supply voltage Vcc, and the operating speeds of the transistors $Q_L'$, $Q_D''$, $Q_L''$ (FIGS. 9, 15 and 16) hardly vary, the signal waveform 101b can be generated earlier, as shown by the wave form 101b'.

Accordingly, it is possible to realize a memory which can operate stably with no delaying in its access time.

The memories of FIGS. 11A and 11B have been described by way of example, but this method can be applied to any other type of memory with the same objectives, without any modification.

As stated above, details of the present invention have been given in accordance with various embodiments thereof, but the potential application of the present invention should not be limited to these embodiments. For example, the present invention can be employed in LSI devices other than memory circuits. It can also be employed in LSI devices which use transistor other than n-type MOS transistors.

What is claimed is:

1. A semiconductor circuit comprising:
   voltage limiter means for limiting a supply voltage to a predetermined primary voltage, wherein the voltage level of said primary voltage is equal to the voltage level of said supply voltage when said voltage level of the supply voltage is below a predetermined voltage level, and further wherein the voltage level of said primary voltage varies in accordance with said voltage level of said supply voltage with a gradient of change less than 1.0 when said supply voltage is above said predetermined voltage level;
   a pulse generating means for generating output pulses according to an input signal, wherein said pulse generating means is supplied with said primary voltage from the voltage limiter means and is also supplied with the supply voltage, and further wherein the output pulses have a voltage level which is limited by said predetermined primary voltage supplied from said voltage limiter means; and
   driver means coupled to receive said supply voltage and said output pulses for driving a capacitance load from a first voltage level to a second voltage level according to said output pulses of the pulse generating means, wherein the capcitance load is supplied with the second voltage from the supply voltage limited by the driver means according to the output pulses.

2. A semiconductor circuit according to claim 1, wherein said driver means comprises a metal insulator semiconductor field effect transistor.

3. A semiconductor circuit according to claim 2, wherein said capacitance load comprises a plurality of signal lines of a memory cell array.

4. A semiconductor circuit according to claim 3, wherein said plurality of signal lines comprises a pair of signal lines electrically balanced with each other, and wherein said driver means further comprises a short-circuit switch used to make respective precharging voltages of said pair of signal lines even with one another.

5. A semiconductor memory comprising:
   a memory cell array having a plurality of memory cells which comprise one MOS transistor and one capacitor, the MOS transistor having a gate, a source and a drain electrode, wherein the gate electrode is connected to a word line controlled by a word driver, wherein one of the source or drain electrode is connected to a data line precharged by a driver transistor, wherein the other of the drain or source electrode is connected to an electrode of the capacitor, and wherein another electrode of the capacitor is connected to a constant potential;
   a first peripheral circuit comprising a word driver supplying address signals for decoding said word lines according to the address signals, and a first precharge circuit for receiving first precharge signals having a predetermined voltage level lower than a supply voltage and for supplying said data lines with a precharging voltage in accordance with said first precharge signals; and
   a second peripheral circuit comprising:
   a voltage limiter means for limiting the supply voltage which is supplied from an external supply voltage and for providing output signals having a predetermined limited voltage level;
   a first pulse generator means for generating a pulse, wherein said first pulse generator is supplied with second precharge signals and with an output signal of said voltage limiter, wherein said pulse generator means includes means for converting said output signal of the voltage limiter into said first precharge signal;
   a pulse limiter means for outputting a limited signal, wherein said pulse limiter means is supplied with output signals of said voltage limiter and a second pulse generator; and
   a voltage converter means which is supplied with an output signal of said voltage limiter and the external supply voltage, wherein said voltage converter includes means for converting said external supply voltage to a predetermined converter voltage level in accordance with the output signal of said voltage limiter, and further wherein said converted voltage level is provided to an input/output circuit coupled to said memory cell array.

6. A semiconductor circuit according to claim 1, wherein said supply voltage, said driver means and said capacitance load are connected to form a series circuit, and further wherein said voltage limiter means and said pulse generating means are not in said series circuit.

7. A semiconductor circuit according to claim 2, wherein said supply voltage, a source-drain path of said transistor and said capacitance load form a series circuit, and further wherein said output pulses of said pulse generating means are coupled to a gate of said transistor.

8. A semiconductor circuit according to claim 5, wherein the voltage level of said second precharge signal is equal to the voltage level of said external supply voltage.

9. A semiconductor circuit according to claim 5, wherein the output signals of said voltage limiter have a voltage level which is equal to the voltage level of said external supply voltage when said voltage level of said external supply voltage is below a predetermined level, and further wherein the voltage level of said output signals of said voltage limiter varies in accordance with the voltage level of said external supply voltage with a gradient of change less than 1.0 when said external supply voltage is above said predetermined voltage level.

* * * * *